(12) United States Patent
Dribinsky et al.

(10) Patent No.: US 7,671,643 B2
(45) Date of Patent: Mar. 2, 2010

(54) POWER-ON-RESET CIRCUIT HAVING ZERO STATIC POWER CONSUMPTION

(75) Inventors: Alexander Dribinsky, Naperville, IL (US); Gregory Pucci, Batavia, IL (US)

(73) Assignee: Memsic, Inc., Andover, MA (US)

( * ) Notice: Subject to any disclaimer, the term of this patent is extended or adjusted under 35 U.S.C. 154(b) by 69 days.

(21) Appl. No.: 12/006,467

(22) Filed: Jan. 3, 2008

(65) Prior Publication Data
US 2009/0174444 A1 Jul. 9, 2009

(51) Int. Cl.
*H03L 7/00* (2006.01)
(52) U.S. Cl. .................. 327/142; 327/198; 327/143
(58) Field of Classification Search ............... 327/142, 327/143
See application file for complete search history.

(56) References Cited

U.S. PATENT DOCUMENTS

| | | | |
|---|---|---|---|
| 6,181,173 B1 | 1/2001 | Homol et al. | |
| 6,407,597 B1 * | 6/2002 | Ishiwaki | 327/142 |
| 6,710,634 B2 | 3/2004 | Ohbayashi et al. | |
| 7,057,427 B2 * | 6/2006 | Wadhwa et al. | 327/143 |
| 7,066,643 B2 * | 6/2006 | Lee et al. | 374/170 |
| 7,196,561 B2 * | 3/2007 | Bhattacharya et al. | 327/143 |
| 2006/0012409 A1 * | 1/2006 | Wadhwa et al. | 327/143 |
| 2006/0044028 A1 * | 3/2006 | Bhattacharya et al. | 327/143 |

\* cited by examiner

*Primary Examiner*—Lincoln Donovan
*Assistant Examiner*—Ryan C Jager
(74) *Attorney, Agent, or Firm*—Weingarten, Schurgin, Gagnebin & Lebovici LLP

(57) ABSTRACT

A power-on-reset (POR) circuit having a zero or substantially zero current state while the supply voltage is in a predetermined, valid range is disclosed. The POR circuit includes a state machine, an oscillator, and output circuitry that are electrically coupled to one another and to a supply voltage. Output from the output circuitry is also provided to the integrated circuit to which the POR circuit is coupled. The state machine includes a plurality of sequential circuits such as latches, flip-flops, and the like that are electrically coupled in a cascade, to provide a ripple counter. The output circuitry is structured and arranged to reset or initialize all of the logic elements on the chip by generating a POR output logic HI (1) signal by Boolean operation of the logic circuitry signal of the state machine for all Boolean states except one. The oscillator is disabled when the POR output logic signal is LO (0), which causes the POR circuit to enter a zero or substantially zero current state.

18 Claims, 2 Drawing Sheets

POWER-ON-RESET CIRCUIT HAVING ZERO STATIC POWER CONSUMPTION

CROSS REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

The present invention is related to the field of power-on-reset circuits and, more particularly, to power-on-reset circuits having a zero current state while the supply voltage is in a predetermined, valid range that is defined as the state in which the logic circuits are functional, and to integrated circuits having such power-on-reset circuits.

Power-on-reset (POR) circuits are commonly used in connection with digital and mixed-signal systems to initialize all logic elements associated with the integrated circuit to a known state simultaneously as soon as the power supply or supply voltage of the electronic circuit is first applied, e.g., during "power-up". More specifically, the POR circuit outputs a reset signal to a plurality of logic elements, e.g., latches, flip-flops or other sequential circuits, until a predetermined threshold supply voltage is reached after power-up. By resetting and maintaining a common state on all of the logic elements simultaneously, the POR circuit prevents aberrant behavior of the electronic device, which may lead to failure or inoperability of the device.

Although the functional intricacies and capabilities of electronic devices require greater power, in design, the cost and benefits of greater power consumption must be weighed against, for example, size, weight, cooling requirements, battery life, and the like. Conventionally, when the electronic device is not in use, modern integrated circuit or "chip" design includes a power-down (PD) function to lower power demand and thereby increase battery life. Hence, when the electronic circuits are in a PD mode, the chip is in an OFF state in which all or substantially all of the active circuits on the chip are OFF. By convention, in a PD state, the specified chip current is less than 1 micro-Ampere ($\mu A$). In practice, the chip current is in the nano-Ampere (nA) range.

To designers, this creates a troublesome paradox. All POR circuits require at least a small amount of current and/or require external or internal voltage references for power-up in order to function properly and, more particularly, to generate a RESET pulse at power-up. However, in many applications that require low power consumption, the power consumed by always-active POR circuits is problematic.

One possible solution involves providing a PD input for the POR circuit that disables the POR circuit in PD mode, causing the POR circuit to consume zero current in PD mode.

Alternatively, many software-controlled systems activate the POR circuit from a PD mode by storing a PD signal in a memory element, e.g., a latch, flip-flop, control register, and the like. Disadvantageously, the memory element may, by chance, initialize the PD signal active at power-up. Such an occurrence, however, would disable the POR circuit at power-up, inhibiting the POR circuit from generating a RESET signal and, thereby, causing the system to fail to initialize properly.

For example, U.S. Pat. No. 6,710,634 to Ohbayashi, et al. discloses a POR circuit for use on a low-power consumption semiconductor having a low power supply voltage. Ohbayashi's POR circuit includes an inverter that drives the reset signal when the voltage at the input node of the inverter exceeds a threshold voltage. According to the teachings of Ohbayashi, the voltage potential at the input node of the inverter is defined by a voltage divider that consists of a p-type MOS transistor in series with an n-type MOS transistor. Ohbayashi, however, does not address instances in which the POR circuit itself is in a PD state.

As another example, U.S. Pat. No. 6,181,173 to Homol, et al. discloses a POR circuit that generates a reset signal as long as the supply voltage is not in the operational range of the electronic device and, once the supply voltage returns to a nominal value, maintains the reset signal for a period of time. Homol, however, also does not address instances in which the POR circuit itself is in a PD state.

Accordingly, it would be desirable to provide a POR circuit that, by design, consumes essentially "zero"—in the nA range—current in its continuously active state. Moreover, because, except for a short time at power-up when a RESET pulse is generated, the POR circuit consumes zero or substantially zero current, it would be desirable to provide a POR circuit that does not rely on a PD input to activate. Finally, it would be desirable to provide a zero current POR circuit that can be left in a powered-up state at all times, since its default state, which is only entered for a very short time after generating a RESET pulse at power-up, consumes zero or substantially zero current.

BRIEF SUMMARY OF THE INVENTION

A power-on-reset (POR) circuit for an integrated circuit having a zero or substantially zero current state while the supply voltage is in a predetermined, valid range is disclosed. The POR circuit includes a state machine, an oscillator, and output circuitry. The state machine, oscillator, and output circuitry are electrically coupled to one another and to a supply voltage. The output circuitry is further coupled to an integrated circuit IC.

The state machine includes a plurality of sequential circuits such as latches, flip-flops, and the like. For example, the state machine can include a plurality of sequential circuits that is electrically coupled in a cascade, to provide a ripple counter. The output circuitry is structured and arranged to generate a POR output logic HI (1) signal as a function of the Boolean state of the state machine. More specifically, generation of a POR output logic HI (1) signal to RESET or initialize all of the logic elements on the chip is based on the Boolean operation of the state machine. Moreover, the output circuitry is structured and arranged to generate a POR output logic HI (1) signal for all Boolean states except one and to generate a POR output logic LO (0) signal for the "magic" state.

The oscillator is adapted to operate as long as the POR output logic signal is HI (1) and to stop when the POR output logic signal is LO (0). More particularly, the oscillator is structured and arranged to oscillate at a frequency range of approximately 20 and 50 MHz as long as the supply voltage equals or exceeds a voltage at which all of the logic circuits on the chip become and remain functional after RESET.

BRIEF DESCRIPTION OF THE SEVERAL VIEWS OF THE DRAWINGS

The invention will be better understood by reference to the following more detailed description and accompanying drawing in which.

DETAILED DESCRIPTION OF THE INVENTION

Figure 1:
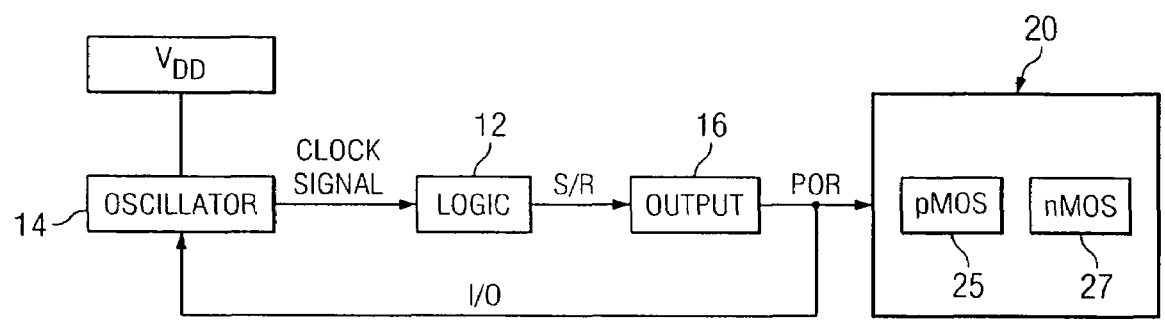
FIG. 1 shows a block diagram of an integrated circuit having a power-on-reset circuit in accordance with the present invention.
Figure 2:
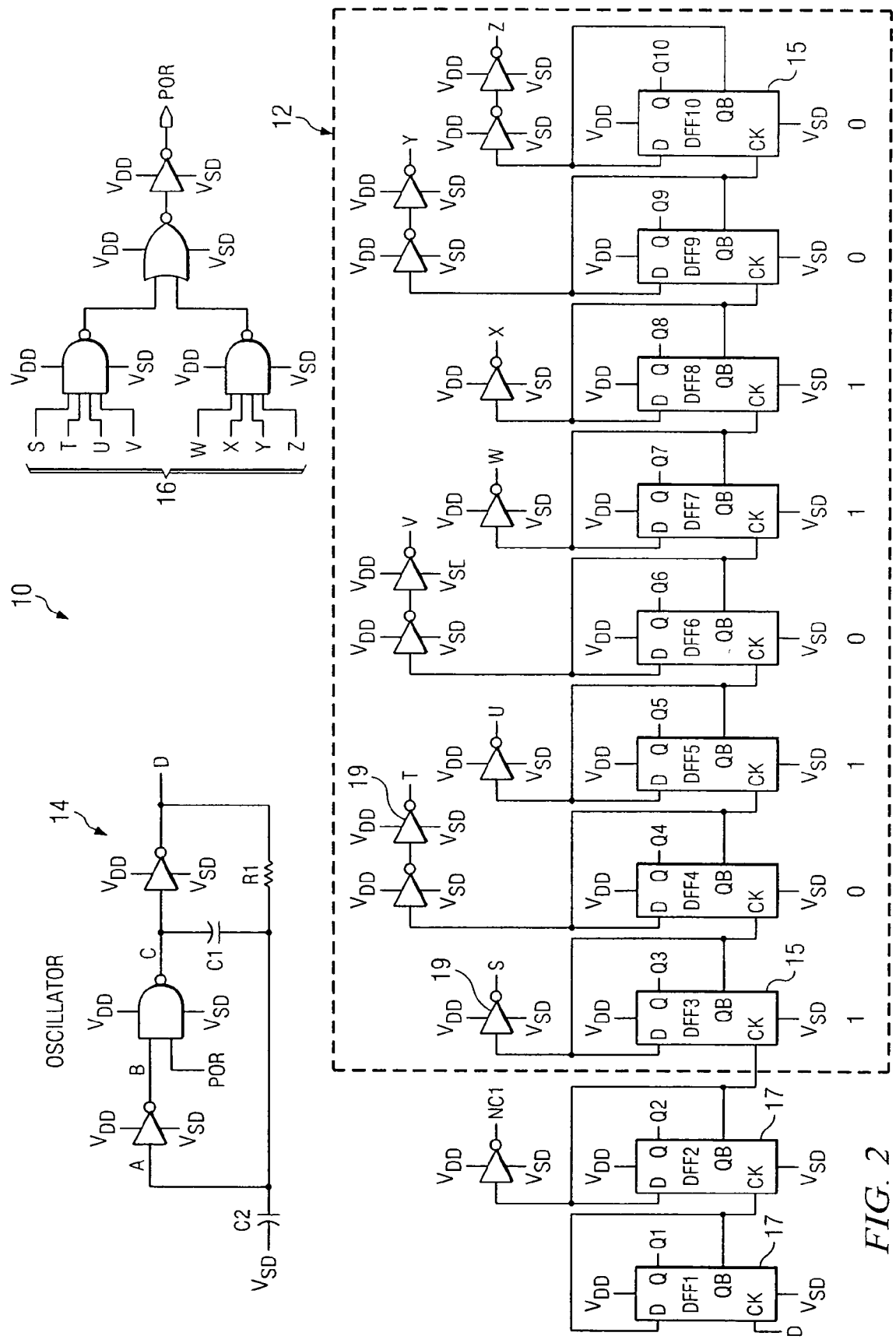
FIG. 2 shows a schematic diagram of a power-on-reset circuit in accordance with the present invention.

Block and schematic diagrams of an integrated circuit (IC) having a power-on-reset circuit and an illustrative power-on-reset (POR) circuit having zero or substantially zero static power consumption for that IC are respectively shown in FIG. 1 and FIG. 2. The POR circuit 10 includes a state machine 12, an oscillator 14, and output circuitry 16. Each of the state machine 12, oscillator 14, and output circuitry 16 is electrically coupled to the other and to a supply voltage ($V_{DD}$). Output from the output circuitry 16 is also provided to the IC 20 to which the POR circuit 10 is coupled. It is understood that the IC 20 includes a multiplicity of logic circuits (not shown) that require RESET during start-up to ensure proper functioning.

The state machine 12 of the POR 10 is a logic circuit that includes a plurality of sequential circuits (designated DFF3-DFF10), such as latches, flip-flops, and the like (hereinafter, "flip-flops 15"). For illustrative purposes only, the flip-flops 15 are electrically coupled in a cascade, to provide a ripple counter. Although the exemplary state machine 12 in FIG. 2 is shown to include eight flip-flops 15, those of ordinary skill in the art can appreciate that any number of flip-flops 15 or other sequential circuits can be used. Furthermore, although the state machine 12 will be described as a ripple counter, the invention is not to be construed as being limited thereto.

Ripple counters are registers in which output from one latch or flip-flop 15 is used to trigger other latches or flip-flops 15. It is well known to those skilled in the art that latches and flip-flops 15 that are placed in close proximity on the same chip and having identical designs, identical layouts (including parasitic effects), identical input loading, and identical output loading have a very high probability of initializing in identical states, either SET or RESET.

The flip-flops 15 are disposed proximate one another on the same IC 20. To increase the probability that all of the flip-flops 15 of the plurality of sequential circuits initialize at an identical state, i.e., either SET or RESET, the flip-flops 15 are arranged to have identical designs, identical layouts, identical input loading, and identical output loading. To increase the likelihood of the flip-flops 15 behaving identically at power-up and initializing to the same state further, the source and load impedances on the outputs of the flip-flops should be the same. Accordingly, to equalize the load impedances, inverters, buffers, and the like 19 can be added to the output of one or more of the flip-flops 15 in the state machine 12.

It should be noted that, even if the flip-flops 15 of the state machine 12 do not all initialize to an identical state at power-up, the POR circuit 10 will still operate properly as long as the flip-flops 15 do not initialize to the "magic" state, which is the one and only Boolean state that would cause the output circuitry 16 to generate a POR output logic LO (0) signal.

The output circuitry 16 is structured and arranged to receive the Boolean operation state of the state machine 12 and to generate a POR output logic signal therefrom. Consequently, based on the operating state of each of the latches or flip-flops 15 in the logic circuitry of the state machine 12 and on the combination of operating states, the output circuitry 16 will generate either a POR output logic HI (1) signal or a POR output logic LO (0) signal. The POR output logic HI (1) signal RESETS or initializes all of the logic elements on the IC 20. The POR output logic HI (1) signal also enables the oscillator 14 to continue operating.

The POR output logic LO (0) signal, on the other hand, removes the RESET signal from all of the memory devices and, also, disables the oscillator 14. Once the oscillator 14 is disabled, the POR circuit 10 enters its normal, which is to say, zero current or substantially zero current state.

The logic circuitry of the state machine 12 and the output circuitry 16 shown in FIG. 2 are structured and arranged so that the output circuitry 16 generates a POR output logic HI (1) signal for all Boolean states of the state machine 12 except 10101100—the "magic" state—and to generate a POR output logic LO (0) signal when the Boolean state corresponds to the "magic" state. Those of ordinary skill in the art can appreciate that this result, i.e., a POR output logic HI (1) signal for all logic Boolean states except one, can be implemented in a myriad of ways. As previously mentioned, inverters and buffers 19 can be added to the output of the flip-flops 15 as necessary to provide identical output loading.

The oscillator 14, e.g., a two-gate oscillator or a "relaxation" oscillator, is adapted to oscillate in a frequency range between approximately 20 and 50 MHz as long as the supply voltage ($V_{DD}$) is within a predetermined, valid range and, otherwise, to enter a zero or substantially zero current state. The invention can be practiced with frequencies higher or lower than 20 to 50 MHz. More particularly, the oscillator 14 is structured and arranged to operate as long as the POR output logic signal is HI (1) and to enter the zero or substantially zero current state when the POR output logic signal is LO (0). Those of ordinary skill in the art can appreciate that the valid range corresponds to positive supply voltages that correspond to the operating state at which all logic circuits associated with the IC 20 are RESET, are functional, and will remain functional after the oscillator 14 and the POR circuit 10 enter a zero or substantially zero current state.

The oscillator 14 includes a plurality of latches or flip-flops 17 (designated DFF 1 and DFF2). The plurality of latches or flip-flops 17 are adapted to provide a clock signal to the state machine counter 12. As shown in FIG. 2, the clock signal will divide the output signal (d) generated by the oscillator 14 by four. Those skilled in the art can appreciate that the number of latches or flip-flops 17 associated with the oscillator 14 can be varied to provide any desired division of the output signal (d) for the state machine 12 clock signal.

It will be apparent to those skilled in the art that modifications to and variations of the disclosed methods and apparatus are possible without departing from the inventive concepts disclosed herein, and therefore the invention should not be viewed as limited except to the full scope and spirit of the appended claims.

What is claimed is:

1. A power-on-reset circuit for use with an integrated circuit, the power-on-reset circuit comprising:
    a state machine having a plurality of sequential circuits, each of which generates a Boolean output signal corresponding to an operating state of the respective sequential circuit;
    an oscillation device that is adapted to generate a clock signal to the state machine and to the plurality of sequential circuits that is capable of changing a state of the state machine; and
    a power-on-reset output circuit that is adapted to generate a power-on-reset signal corresponding to at least one state of said state machine, the oscillation device and state machine being structured and arranged to deliver an initial reset signal to the power-on-reset output circuit during power-up and the power-on-reset circuit having zero or substantially zero static power consumption and entering a zero or a substantially zero current state whenever the oscillation device is not oscillating.

2. The power-on-reset circuit as recited in claim 1, wherein the sequential circuits are latches or flip-flops.

3. The power-on-reset circuit as recited in claim 1, wherein the state machine is a counter.

4. The power-on-reset circuit as recited in claim 1, wherein each of the plurality of sequential circuits is proximate others of the plurality of sequential circuits on the same integrated circuit; and further having at least one of:
   identical or substantially identical designs,
   identical or substantially identical layouts,
   identical or substantially identical input loading, and
   identical or substantially identical output loading.

5. The power-on-reset circuit as recited in claim 1, wherein the oscillation device is a relaxation oscillator.

6. The power-on-reset circuit as recited in claim 1, wherein the oscillation device oscillates when a supply voltage is within a predetermined valid range and is disabled when the supply voltage is outside of the predetermined valid range.

7. The power-on-reset circuit as recited in claim 6, wherein the valid range corresponds to a state in which all logic circuits on the integrated circuit are RESET.

8. The power-on-reset circuit as recited in claim 1, wherein the power-on-reset output circuit is adapted to generate a power-on reset output logic LO signal only when it receives a predetermined combination of operating states of the state machine, otherwise said power-on-reset output circuit generates a power-on reset output logic HI signal.

9. The power-on-reset circuit as recited in claim 1, wherein the oscillation device and state machine are adapted for a zero or substantially zero current state for zero static power consumption.

10. A method of operating a power-on-reset circuit with zero or substantially zero static power consumption of an integrated circuit, the method comprising:
   powering up the integrated circuit;
   with power-up, delivering an initial reset signal to a power on-reset output circuit using an oscillation device and a state machine, delivering of the initial reset signal including:
      generating a clock signal capable of changing an operating state of said state machine, and
      generating Boolean signals corresponding to the operating state of said state machine;
   generating a power-on-reset signal for transmission to the integrated circuit; and
   disabling the oscillation device and state machine after the power-on-reset output circuit generates the power-on-reset signal, to place the power-on-reset circuit into a zero static power consumption state and a zero or a substantially zero current state.

11. The method as recited in claim 10, wherein the clock signal is generated as long as at least one logic circuit on the integrated circuit is RESET.

12. The method as recited in claim 10, wherein a power-on reset output logic LO signal is generated only when a predetermined combination of operating states of said state machine occurs, otherwise said power-on-reset output circuit generates a power-on reset output logic HI signal.

13. An integrated circuit comprising:
   a plurality of logic elements;
   a power-on-reset circuit for initializing said logic elements simultaneously, the power-on-reset circuit including:
      a state machine including a plurality of sequential circuits, each of which generates a Boolean output signal corresponding to an operating state of the respective sequential circuit, for delivering the Boolean output signal to the power-on-reset output circuit;
      an oscillation device that is adapted to deliver a clock signal to the state machine and to the plurality of sequential circuits that is capable of changing a state of the state machine; and
      a power-on-reset output circuit that is adapted to generate a power-on-reset signal corresponding to at least one state of said state machine,
      the oscillation device and state machine being structured and arranged to deliver an initial reset signal to the power-on-reset output circuit during power-up and
      the power-on-reset circuit having zero or substantially zero static power consumption and entering a zero or a substantially zero current state whenever the oscillation device is not oscillating.

14. The integrated circuit as recited in claim 13, wherein the state machine is a counter.

15. The integrated circuit as recited in claim 13, wherein the oscillation device oscillates at a frequency between approximately 20 MHz and approximately 50 MHz when a supply voltage is in a predetermined valid range.

16. The integrated circuit as recited in claim 15, wherein the valid range corresponds to a state in which all logic circuits on the integrated circuit are RESET.

17. The integrated circuit as recited in claim 13, wherein the power-on-reset output circuit is adapted to generate a power-on reset output logic LO signal only when it receives a predetermined combination of operating states of the plurality of sequential circuits of the state machine, otherwise said power-on-reset output circuit generates a power-on reset output logic HI signal.

18. The integrated circuit as recited in claim 13, wherein the oscillation device and state machine are adapted for a zero or substantially zero current state for zero static power consumption.

* * * * *